United States Patent
Chang et al.

(10) Patent No.: US 6,681,286 B2
(45) Date of Patent: Jan. 20, 2004

(54) CONTROL CHIPSET HAVING DUAL-DEFINITION PINS FOR REDUCING CIRCUIT LAYOUT OF MEMORY SLOT

(75) Inventors: Nai-Shung Chang, Taipei Hsien (TW); Chia-Hsing Yu, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 384 days.

(21) Appl. No.: 09/756,324

(22) Filed: Jan. 8, 2001

(65) Prior Publication Data
US 2002/0019919 A1 Feb. 14, 2002

Related U.S. Application Data
(60) Provisional application No. 60/177,906, filed on Jan. 25, 2000.

(30) Foreign Application Priority Data
Jul. 5, 2000 (TW) .................................. 89113310 A

(51) Int. Cl.⁷ .............................................. G06F 13/00
(52) U.S. Cl. ................. 710/316; 36/39; 36/52; 365/189.02; 365/230.02; 365/230.05; 365/230.08
(58) Field of Search ................... 365/189.02–189.05, 365/230.02–230.05; 710/36–39, 52–59, 107, 316–317; 711/167–170

(56) References Cited

U.S. PATENT DOCUMENTS

| | | | | | |
|---|---|---|---|---|---|
| 5,953,243 | A | * | 9/1999 | Capps, Jr. et al. | 365/52 |
| 6,018,782 | A | * | 1/2000 | Hartmann | 710/310 |
| 6,031,752 | A | * | 2/2000 | Lai et al. | 365/52 |
| 6,112,316 | A | * | 8/2000 | Porterfield | 714/43 |
| 6,286,097 | B1 | * | 9/2001 | Chang et al. | 713/2 |
| 6,370,053 | B2 | * | 4/2002 | Chang et al. | 365/51 |
| 6,377,510 | B2 | * | 4/2002 | Chang et al. | 365/230.06 |
| 6,424,555 | B1 | * | 7/2002 | Chang | 365/63 |
| 6,465,336 | B2 | * | 10/2002 | Gabara et al. | 438/599 |
| 6,496,888 | B1 | * | 12/2002 | Pole, II | 710/110 |
| 6,498,759 | B2 | * | 12/2002 | Chang et al. | 365/226 |

* cited by examiner

Primary Examiner—Christopher B. Shin
(74) Attorney, Agent, or Firm—J. C. Patents

(57) ABSTRACT

A control chipset having dual-definition data pins capable of reducing circuit layout to memory module slots. Using dual-definition data pins of the control chipset and multiplexing/de-multiplexing devices, the control chipset is able to sense the particular type of memory modules plugged into memory slots automatically and hence assigning the function to each data pin accordingly. Consequently, circuit layout from the control chipset to the data pins of far off memory slots is simplified and overall circuit length is greatly reduced.

14 Claims, 4 Drawing Sheets

CONTROL CHIPSET HAVING DUAL-DEFINITION PINS FOR REDUCING CIRCUIT LAYOUT OF MEMORY SLOT

CROSS-REFERENCE TO RELATED APPLICATION

This application claims the priority benefit of U.S.A. Provisional application No. 60/177,906 filed Jan. 25. 2000, and the priority benefit of Taiwan application serial No.89113310, filed Jul. 5, 2000.

BACKGROUND OF THE INVENTION

1. Field of Invention

The present invention relates to a control chipset. More particularly, the present invention relates to a control chipset having dual-definition data pins. The dual-definition data pins are used to minimize overall wiring length of circuits from the control chipset to a memory module slot.

2. Description of Related Art

Synchronous dynamic random access memory (SDRAM) is often used in personal computers. SDRAM responds to the rising edge of a system clock cycle to carry out data a transmission operation. Another type of memory is double-data-rate dynamic random access memory (DDR DRAM). For a DDR DRAM, a data transmission operation is triggered at the rising edge and the falling edge of a system clock cycle. Hence, operating frequency of a DDR DRAM is almost double that of a SDRAM.

The operating modes of SDRAM and DDR DRAM differ in many other aspects, including: (1) SDRAM uses normal clock pulse signals while DDR DRAM uses differential clock signals; (2) SDRAM uses $V_{DD}$=3.3V while DDR DRAM uses $V_{DD}$=2.5V and $V_{DDQ}$=2.5V; (3) SDRAM does not require a reference voltage, but DDR DRAM requires a reference voltage whose value is about ½ $V_{DDQ}$; (4) SDRAM connects to a data bus that operates on CMOS logic while DDR DRAM connects to a data bus that operates on series-stub-terminated logic 2 (STTL_2); (5) there is no need for the SDRAM connected data bus connected to use a terminated voltage ($V_{TT}$), but DDR DRAM connected data bus must use a terminated voltage ($V_{TT}$) to absorb reflected waves; and (6) there is no need for the SDRAM connected data bus to use a pull-up resistor, but the DDR DRAM connected data bus must use a pull-up resistor. Nevertheless, a DDR DRAM is able to operate at a speed roughly double that of the SDRAM.

FIG. 1 is a block diagram showing the component layout of a conventional computer motherboard. The motherboard 100 includes a central processing unit (CPU) 140, a control chipset 110, a plurality of memory slots 120 for accommodating first type memory modules, a plurality of memory slots 130 for accommodating second type memory modules, a plurality of peripheral component interconnect (PCI) slots 150 an accelerated graphic port (AGP) slot 160 and a clock pulse generator 170. Control chipset 110 has a plurality of data pins MD[0:63]. Each memory slot 120 has a plurality of data pins MD[0:63] for meshing with a 184-pin memory module. Each memory slot 130 has a plurality of data pins MD[0:63] for meshing with a 168-pin memory module. Each PCI slot 150 is used for accommodating a PCI interface card. AGP slot 160 is used for accommodating a window accelerator card. Clock pulse generator 170 is used for providing the much needed clock pulses to the memory modules.

As shown in FIG. 1, data pins MD[0:63] of control chipset 110 are directly connected to data pins MD[0:63] of memory slots 120 and data pins MD[0:63] of memory slots 130 respectively. The assignment of data pins MD[0:63] between memory slots 120 and memory slots 130 are very different. Hence, if similarly defined data pins of memory slot 120 and memory slot 130 are to be wired together, overall length of wires from data pins MD[0:63] of memory slot 120 to memory slot 130 may be excessive.

Table No. 1 illustrates the assignment of data pins MD[0:63] for memory slots 120 and memory slots 130. As shown in Table No. 1, data pins MD63 of memory slots 120 are connected to data pin MD0 of memory slots 130. Similarly, data pins MD32 of memory slots 120 are connected to data pins MD15 of memory slots 130, and data pins MD0 of memory slots 120 are connected to data pins MD63 of memory slots 130 and so on. Only through this type of data pin assignments, wiring layout problems can be minimized.

TABLE 1

Assignment of data pins MD[0:63] for 184-pin memory module slots and 168-pin memory module slots.

| 184 | 168 | 184 | 168 | 184 | 168 | 184 | 168 |
|---|---|---|---|---|---|---|---|
| MD63 | MD0 | MD46 | MD8 | MD27 | MD16 | MD10 | MD24 |
| MD59 | MD32 | MD47 | MD40 | MD31 | MD48 | MD11 | MD56 |
| MD62 | MD1 | MD42 | MD9 | MD26 | MD17 | MD14 | MD25 |
| MD58 | MD33 | MD43 | MD41 | MD30 | MD49 | MD15 | MD57 |
| MD61 | MD2 | MD45 | MD10 | MD25 | MD18 | MD12 | MD26 |
| MD57 | MD34 | MD41 | MD42 | MD29 | MD50 | MD13 | MD58 |
| MD60 | MD3 | MD40 | MD11 | MD24 | MD19 | MD8 | MD27 |
| MD56 | MD35 | MD44 | MD43 | MD28 | MD51 | MD9 | MD58 |
| MD55 | MD4 | MD39 | MD12 | MD19 | MD20 | MD7 | MD28 |
| MD51 | MD36 | MD35 | MD44 | MD23 | MD52 | MD3 | MD60 |
| MD54 | MD5 | MD34 | MD13 | MD18 | MD21 | MD2 | MD29 |
| MD50 | MD37 | MD38 | MD45 | MD22 | MD53 | MD6 | MD61 |
| MD52 | MD6 | MD33 | MD14 | MD17 | MD22 | MD5 | MD30 |
| MD53 | MD38 | MD37 | MD46 | MD21 | MD54 | MD1 | MD62 |
| MD48 | MD7 | MD32 | MD15 | MD20 | MD23 | MD4 | MD31 |
| MD49 | MD39 | MD36 | MD47 | MD16 | MD55 | MD0 | MD63 |

SUMMARY OF THE INVENTION

Accordingly, one object of the present invention is to provide a control chipset having dual-definition data pins for reducing the wiring layout to memory module slots. The control chipset of this invention is designed according to the data pin assignment of Table No. 1 but each data pin is a dual-definition pin. For example, data pins MD63 are defined to be MD63/MD0, data pins MD59 are defined to be MD59/MD32, data pins MD62 are defined to be MD62/MD1, ..., and data pins MD0 are defined to be MD0/MD63. Hence, data pins MD[0:63] of first type memory modules can be linked closely with data pins MD[0:63] of second type memory modules. Together with a control chipset capable of outputting data to various data pins MD[0:63], problem of having to use excessive wires to link up data pins MD[0:63] between a first and a second type memory slot is greatly minimized.

When first type memory modules are in first type memory slots, the control chipset outputs data to the data pins MD63, MD59, MD62, ..., MD0, a configuration for operating first type memory module. On the other hand, when second type memory modules are in second type memory slots, the control chipset outputs data to data pins MD0, MD32, MD1, ..., MD63, a configuration for operating second type memory module.

The control chipset of this invention has n data pins with each data pin serving dual functions. In other words, the jth data pin is defined as the ath pin of a first sequence and the bth pin of a second sequence while the kth data pin is defined as the bth pin of the first sequence and the cth pin of the second sequence. The control chipset includes a first first-in first-out (FIFO) memory, a multiplexing device, a second first-in first-out (FIFO) memory and a de-multiplexing device. The first FIFO memory has at least n pin output terminal for temporarily holding output data. The multiplexing device is connected to the first FIFO memory and the n data pins of the control chipset. The multiplexing device has n first type input terminals, n second type input terminals, n output terminals and a selective input terminal. Whether the xth output terminal of the n output terminals is equal to the xth input terminal of the first type input terminals or the xth input terminal of the second type input terminals depends on the selective input terminal of the multiplexing device. The xth output terminal is connected to the xth data pin of a plurality of data pins. The bth pin output terminal of the first FIFO memory is connected the jth input terminal of the second type input terminal and the kth input terminal of the first type input terminal. The second FIFO memory has at least n pin input terminal for temporarily holding input data. The de-multiplexing device is connected to the n data pins of the control chipset. The de-multiplexing device has n first type output terminals, n second type output terminals, n input terminals and a selective input terminal. Whether the xth input terminal of the n input terminals is equal to the xth output terminal of the first type output terminals or the xth output terminal of the second type output terminals depends on the selective input terminal of the de-multiplexing device. The xth input terminal is connected to the xth data pin of the plurality of data pins. The bth pin input terminal of the second FIFO memory is connected the jth output terminal of the second type output terminal and the kth output terminal of the first type output terminal. In the aforementioned description, n is a positive integer greater than zero and a,b,c,j,k,x are integer values greater than or equal to zero but smaller than n.

The control chipset can be applied to a computer motherboard. The computer motherboard includes a memory slot for accommodating a first type memory module and a memory slot for accommodating a second type memory module. When the control chipset needs to access the first type memory module, the selective signal pin of the multiplexing device is set so that the n output terminals of the multiplexing device is equivalent to the first type input terminals. The selective signal pin of the de-multiplexing device is set so that the first type output terminal of the de-multiplexing device is equivalent to n input terminals. When the control chipset needs to access the second type memory module, the selective signal pin of the multiplexing device is set so that the n output terminals of the multiplexing device is equivalent to the second type input terminals. The selective signal pin of the de-multiplexing device is set so that the second type output terminal of the de-multiplexing device is equivalent to n input terminals.

The first type memory module and the second type memory module have memory module type data. The motherboard further includes a central processing unit (CPU). On starting the computer system, the CPU will read and store the memory module type data via the control chipset so that the type of memory modules to be accessed by the system can be determined.

Each output terminal of the first FIFO memory is connected to the two input terminals of a multiplexer. For example, the dual-definition data pin MD63/MD0 is connected to the MD63 input terminal and the MD0 input terminal of a multiplexer. Similarly, the dual-definition data pin MD32/MD15 is connected to the MD32 input terminal and the MD15 input terminal of another multiplexer. The multiplexing device of this invention includes n 2-to-1 multiplexers. Hence, the multiplexing device has $2n$ conductive lines (altogether 128 conductive lines) for linking with the first FIFO memory. When a first type memory module is plugged into the special memory slot for accommodating first type memory module, the control chipset can access data from data pins MD[0:63] according to the data pin arrangement for interfacing with a first type memory module by reading a memory selection signal from the memory module. Similarly, when a second type memory module is plugged into the special memory slot for accommodating second type memory module, the control chipset can access data from data pins MD[0:63] according to the data pin arrangement for interfacing with a second type memory module. With such design, wiring layout to a slot for accommodating a second type memory module is greatly optimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
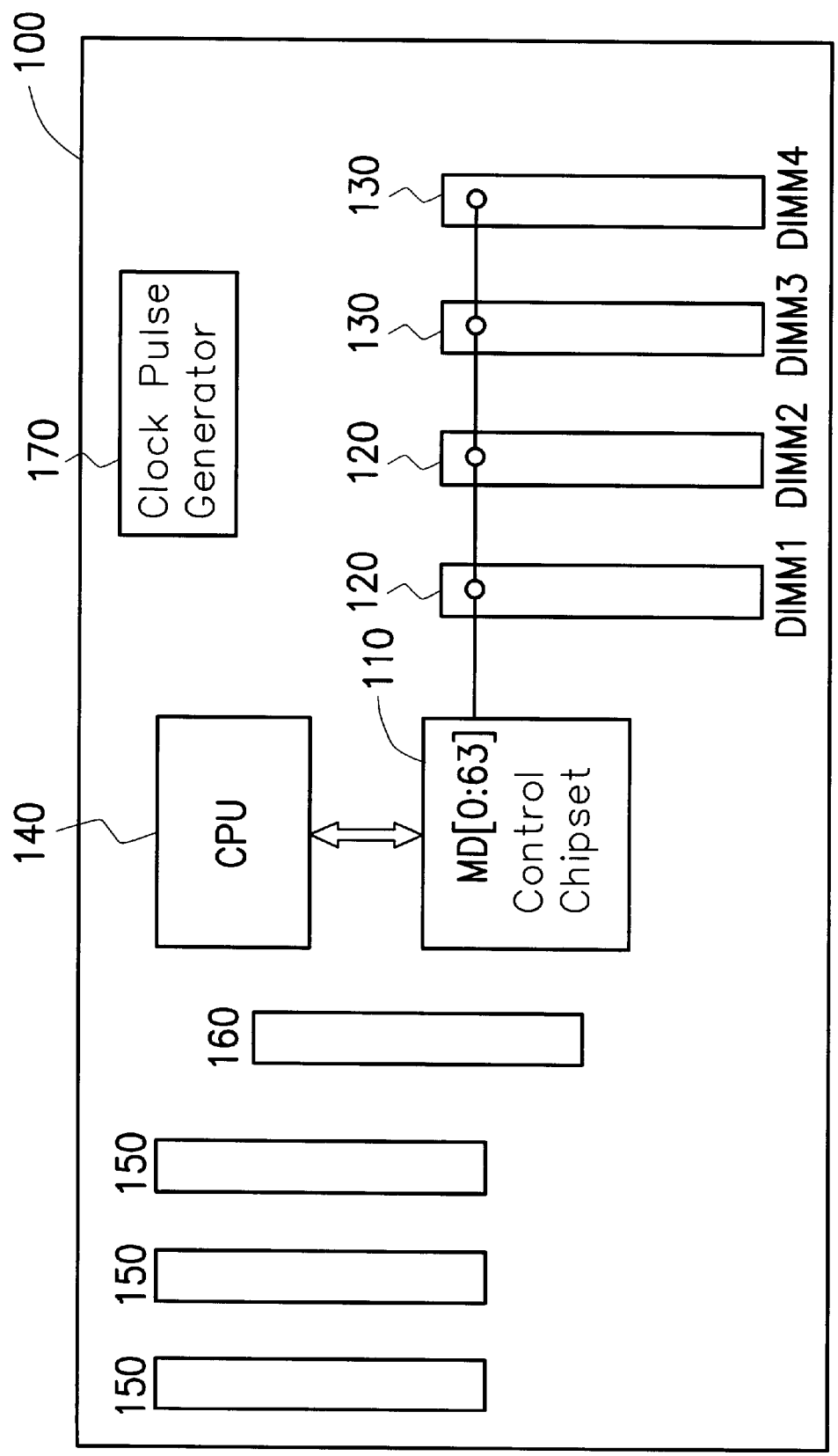
FIG. 1 is a block diagram showing the component layout of a conventional computer motherboard.
Figure 2:
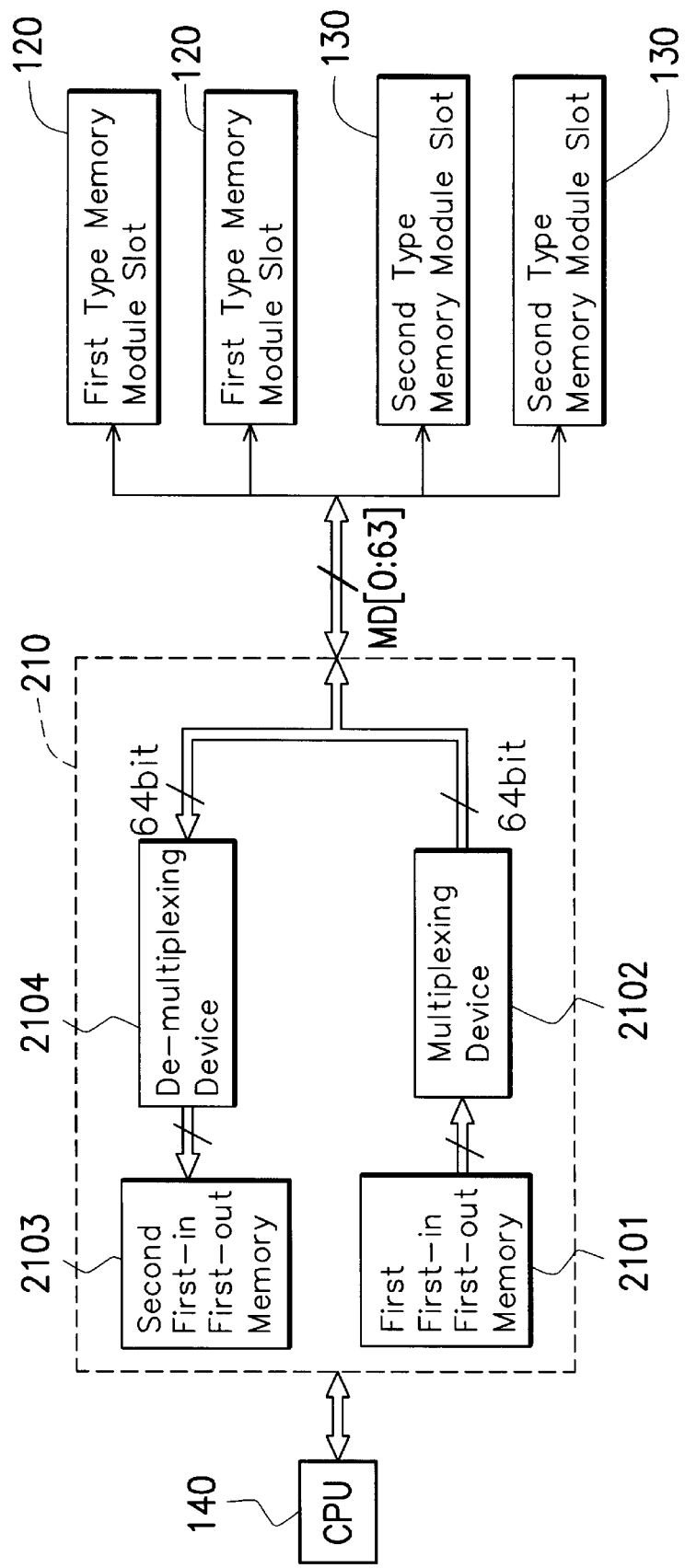
FIG. 2 is a block diagram showing a control chipset and related components according to one preferred embodiment of this invention.

Reference will now be made in detail to the present preferred embodiments of the invention, examples of which FIG. 2 is a block diagram showing a control chipset and related components according to one preferred embodiment of this invention. This invention utilizes a control chipset 210 having dual-definition data pins to reduce wiring layout from control chipset 210 to memory slots. Control chipset 210 mounts on a computer motherboard and has n data pins MD[0:63], here n equals 64. Each data pin is doubly defined. For example, data pin MD63 is defined to be MD63/MD0, data pin MD59 is defined to be MD59/MD32, data pin MD62 is defined to be MD62/MD1, . . . and MD0 is defined to be MD0/MD63. The motherboard at least includes a central processing unit (CPU) 140, a first type memory module slot 120 and a second type memory module slot 130. The first type memory module slot 120 has n data pins MD[0:63] for plugging a first type memory module (not shown). The second type memory module slot 130 also has n data pins MD[0:63] for plugging a second type memory module (not shown), but assignment sequence of data pins in the second type slot 130 is different from that of the first type slot 120. Both the first type memory module and the second type memory module have an electrically erasable programmable read-only-memory (EEPROM) for providing a memory selection signal. The memory selection signal is transferred to control chipset 210 through the basic input/output system (BIOS) on starting a computer. Hence, the memory type of memory modules are disclosed and the data pins MD[0:63] corresponding to the memory type are assigned.

According to memory selection signal, the n dual-definition data pins of control chipset 210 is able to arrange the data pins MD[0:63] in sequence for operating a first type memory module or a second type memory module. For example, when data on a first type memory module need to be access, the memory selection signal can be set such that the n data pins MD[0:63] of control chipset 210 can be arranged to follow a sequence for operating a first type memory module. Similarly, when data on a second type memory module need to be access, the memory selection signal can be set such that the n data pins MD[0:63] of control chipset 210 can be arranged to follow a sequence for operating a second type memory module. By switching the memory selection signal, control chipset 210 is capable of supporting both first type memory modules and second type memory modules on a motherboard at the same time. The first type memory module slot can be a 184-pin slot and the second type memory module slot can be a 168-pin slot, for example. Note that the first type memory module slot can be a 168-pin slot and the second type memory module slot can a 184-pin slot. In fact, the memory module slot can be a slot for accommodating a module with any number of data pins.

Control chipset 210 includes a first-in first-out (FIFO) memory 2101 coupled to a central processing unit (CPU) 140. FIFO memory 2101 has n input terminal and n output terminal, where n=64. FIFO memory 2101 are used for temporarily holding data HD[0:63] output from CPU 140 and outputting the data in a first-in first-out manner. Control chipset 210 also includes a multiplexing unit 2102 coupled to FIFO memory 2101. Multiplexing unit 2102 has 128 input terminals, 64 output terminals and a selection input terminal. According to the memory selection signal, 64 of the 128 input terminals from the data pins MD[0:63] of control chipset 210 is wired to the data pins MD[0:63] of first type memory module slot 120 or the data pins MD[0:63] of second type memory module slot 130. A de-multiplexing device 2104 is coupled to the data pins MD[0:63] of control chipset 210 as well as the data pins MD[0:63] of the first type memory module slot 120 or the data pins MD[0:63] of the second type memory module slot 130. De-multiplexing device 2104 has 64 input terminals, 128 output terminals and a selection input terminal. According to the memory selection signal, the 64 input terminals are de-multiplexed to 64 of the 128 output terminals. Control chipset also includes a first-in first-out (FIFO) memory 2103 coupled to de-multiplexing device 2104. FIFO memory 2103 has 64 input terminals and 64 output terminals for temporarily holding data from de-multiplexing device 2104 and then outputting sequentially to CPU 140.

Figure 3:
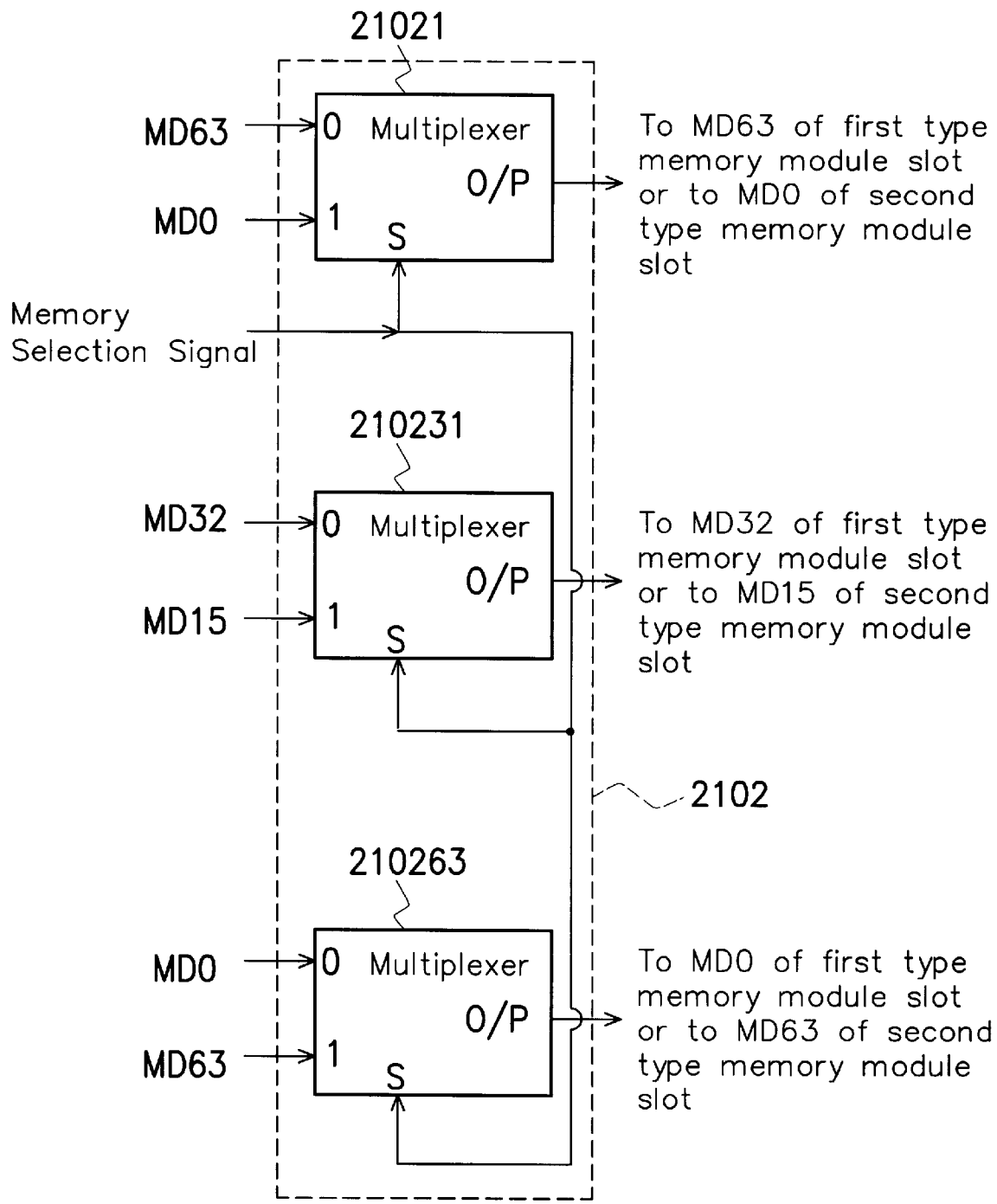
FIG. 3 is a block diagram showing the internal elements of a multiplexing device according to this invention.

FIG. 3 is a block diagram showing the internal elements of a multiplexing device according to this invention. As shown in FIG. 3, multiplexing device 2102 comprises of 64 2-to-1 multiplexers. The 128 input terminal of multiplexing device 2102 are connected to data pins MD[0:63] of FIFO memory 2101. According to the dual-definition data pins of control chipset 210, the data pins MD[0:63] of FIFO memory 2101 are respectively coupled to the 128 input terminals of multiplexing device 2102. For example, if data pin MD is defined to serve as a dual-definition pin for MD63/MD0, data pins MD63 and MD0 are coupled to the input terminals of a multiplexer 21021; if data pin MD18 is defined to serve as a dual-definition pin for MD18/MD21, data pins MD18 and MD21 are coupled to the input terminals of a multiplexer 210245; if data pin MD32 is defined to serve as a dual-definition pin for MD32/MD15, data pins MD32 and MD15 are coupled to the input terminals of a multiplexer 210231, . . . , and, if data pin MD63 is defined to serve as a dual-definition pin for MD63/MD0, data pins MD63 and MD0 are coupled to the input terminals of a multiplexer 210263.

When a first type memory module is plugged into memory slot 120, memory selection signal will trigger such that multiplexer 21021 outputs MD63, multiplexer 210231 outputs MD32, . . . , and multiplexer 210263 outputs MD0, all outputs going to the data pins MD[0:63] of memory slot 120. Similarly, when a second type memory module is plugged into memory slot 130, memory selection signal will deactivate such that multiplexer 21021 outputs MD0, multiplexer 210231 outputs MD15, . . . , and multiplexer 210263 outputs MD63, all outputs going to the data pins MD[0:63] of memory slot 130. Consequently, depending on the type of memory modules plugged into memory slots, control chipset 210 will automatically output data through appropriately assigned data pins MD[0:63]. Hence, wiring layout to memory module slots 130 is considerably optimized.

In this invention, multiplexing device 2102 and de-multiplexing device 2104 are needed to service dual-definition data pins. Hence, internal circuit layout of the control chipset is slightly more complicated. However, due to rapid advance in circuit integration techniques, the additional devices can be easily incorporated into the integrated circuit without occupying too much chip area.

Figure 4:
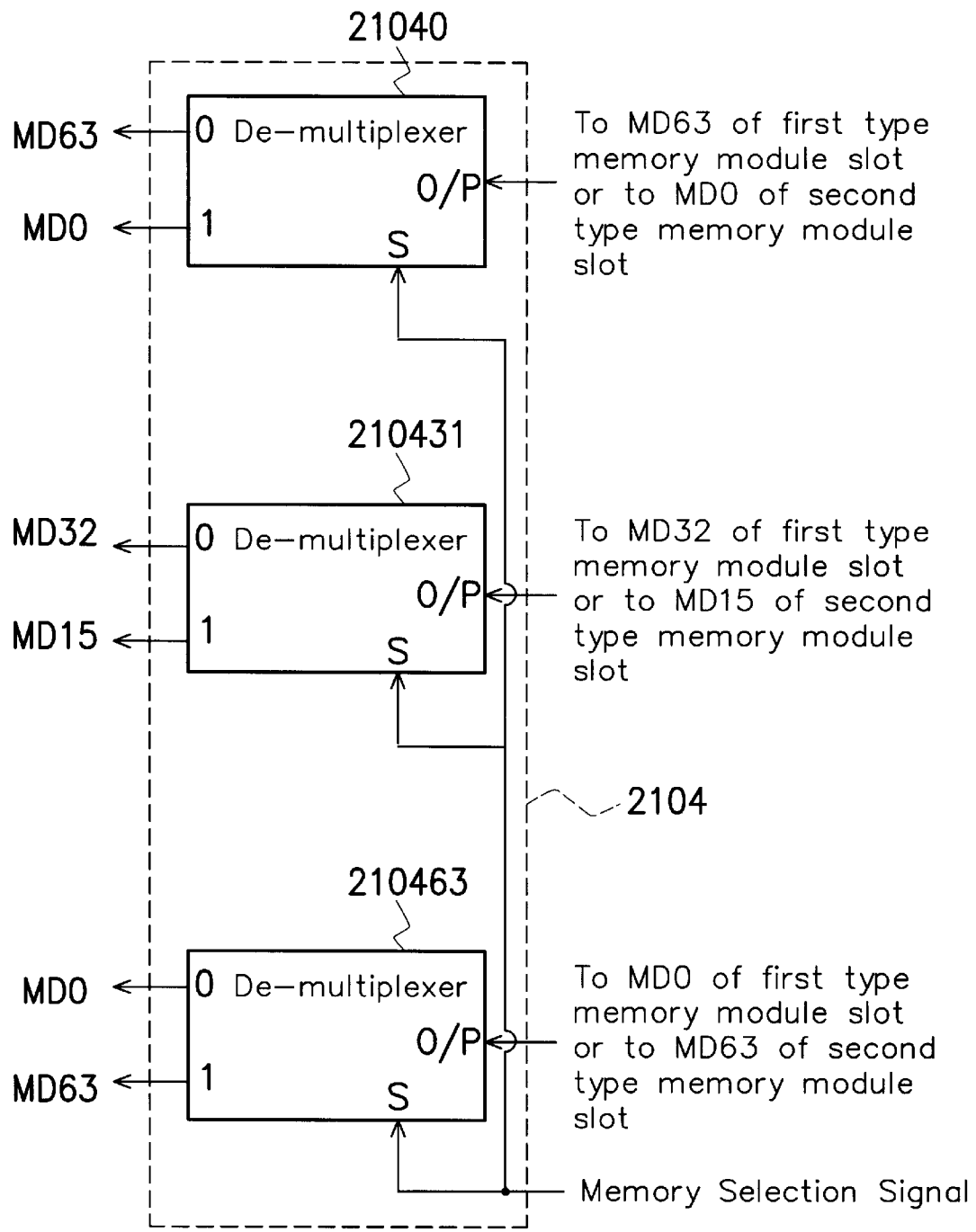
FIG. 4 is a block diagram showing the internal elements of a de-multiplexing device according to this invention.

FIG. 4 is a block diagram showing the internal elements of a de-multiplexing device according to this invention. As shown in FIG. 4, de-multiplexing device 2104 comprises of 64 1-to-2 de-multiplexers. The 64 input terminals of de-multiplexing device 2104 are connected to the data pins MD[0:63] of control chipset 210 as well as the data pins MD[0:63] of the memory module slots. The 128 output terminal of de-multiplexing device 2104 are connected to the data pins MD[0:63] of FIFO memory 2103 according to the dual-definition data pins of control chipset 210.

For example, when a first type memory module is plugged into memory slot 120, MD63 of memory slot 120 is connected to the input terminal of a de-multiplexer 21040, MD32 is connected to the input terminal of a de-multiplexer 210431, . . . , and MD0 is connected to the input terminal of a de-multiplexer 210463. In the meantime, the memory selection signal will trigger such that de-multiplexer 21040 re-directs MD63 to MD63 output terminal of FIFO memory 2103, de-multiplexer 210431 re-directs MD32 to MD32 output terminal of FIFO memory 2103, . . . , and de-multiplexer 210463 re-directs MD0 to MD0 output terminal of FIFO 2103. On the other hand, when a second type memory module is plugged into memory slot 130, MD0 of memory slot 130 is connected to the input terminal of a de-multiplexer 21040, MD15 is connected to the input terminal of a de-multiplexer 210431, . . . , and MD63 is connected to the input terminal of a de-multiplexer 210463. In the meantime, the memory selection signal will deactivate such that de-multiplexer 21040 re-directs MD0 to MD0 output terminal of FIFO memory 2103, de-multiplexer 210431 re-directs MD15 to MD15 output terminal of FIFO memory 2103, . . . , and de-multiplexer 210463 re-directs MD63 to MD63 output terminal of FIFO 2103.

In summary, this invention provides a control chipset having dual-definition data pins capable of reducing circuit layout to memory module slots. Using dual-function data pins of control chipset and multiplexing/de-multiplexing devices, the control chipset automatically senses the particular type of memory modules plugged into memory slots and assigning the function to each data pin accordingly. Consequently, circuit layout from the control chipset to the data pins of far off memory slots is simplified and overall circuit length is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A control chipset having n dual-definition data pins for optimizing a circuit layout such that a jth data pin is defined to be an ath pin of a first data-pin sequence and a bth pin of a second data-pin sequence while a kth data pin is defined to be the bth pin of the first data-pin sequence and a cth pin of the second data-pin sequence, comprising:

a first first-in first-out (FIFO) memory for temporarily holding an output data having at least n pin output terminals;

a multiplexing device coupled to the first FIFO memory and the n data pins of the control chipset, wherein the multiplexing device includes n first type input terminals, n second type input terminals, n output terminals and a selection input terminal, and whether an xth output terminal of the n output terminals is coupled to an xth input terminal of the n first type input terminals or an xth input terminal of the n second type input terminals is determined by a signal at the selection input terminal, the xth output terminal is connected to an xth data pin of the data pins, a bth pin output terminal of the first FIFO memory is connected to a jth input terminal of the n second type input terminals of the multiplexing device and a kth input terminal of the n first type input terminals of the multiplexing device;

a second first-in least n pin input terminals; and a de-multiplexing device coupled to the n data pins of the control chipset, wherein the de-multiplexing device has n first type output terminals, n second type output terminals, n input terminals and a selection input terminal, whether an xth input terminal of the n input terminals is coupled to an xth output terminal of the n first type output terminals or an xth output terminal of the n second type output terminals is determined by a signal at the selection input terminal of the de-multiplexing device, the xth input terminal is connected to an xth data pin of the data pins, and a bth pin input terminal of the second FIFO memory is connected to a jth output terminal of the n second type output terminals of the de-multiplexing device and a kth output terminal of the n first type output terminals of the de-multiplexing device;

wherein n is an integral value greater than zero and defines a total number of the data pins, and a, b, c, j, k, x are integral value to indicate a specific pin in the data-pin sequences.

2. The control chip set of claim 1, wherein the control chipset mounts on a computer motherboard further comprising:

a first type memory module slot for plugging a first type memory module; and a second type memory module slot for plugging a second type memory module slot wherein when data in the first type memory module needs to be accessed by the control chipset, the selection signal renders the n output terminals of the multiplexing device equivalent to the first type input terminals, and the selection signal of the de-multiplexing device renders the first type output terminals of the de-multiplexing device equivalent to the n input terminal, and when data in the second type memory module need to be accessed by the control chipset, the selection signal of the multiplexing device renders the n output terminals of the multiplexing device equivalent to the second type input terminals, and the selection signal renders the second type output terminals of the de-multiplexing device equivalent to the n input terminal.

3. The control chipset of claim 2, wherein both the first type memory module and the second type memory module have a memory module type data storage area and the motherboard further includes a central processing unit (CPU) that is able to read out the memory module type data through the control chipset during system boot up so that the type of memory module to be accessed can be subsequently determined.

4. The control chipset of claim 3, wherein the memory module type data is stored in an electrically erasable programmable read-only-memory (EEPROM) unit.

5. The control chipset of claim 2, wherein the multiplexing device further includes 64 2-to-1 multiplexers.

6. The control chipset of claim 2, wherein the de-multiplexing device further includes 64 1-to-2 de-multiplexers.

7. The control chipset of claim 2, wherein the value n for the number of input data pins is 64.

8. A control chipset having n dual-definition data pins for optimizing a circuit layout such that a jth data pin is defined to be an ath pin of a first data-pin sequence and a bth pin of a second data-pin sequence while a kth data pin is defined to be a bth pin of the first data-pin sequence and a cth pin of the second data-pin sequence, comprising:

a first first-in first-out (FIFO) memory for temporarily holding an output data having at least n pin output terminals;

a multiplexing device coupled to the first FIFO memory and the n data pins of the control chipset, wherein the multiplexing device includes n first type input terminals, n second type input terminals, n output terminals and a selection input terminal, a bth pin output terminal of the n pin output terminals of the first FIFO memory is connected to a jth input terminal of the n second type input terminals and a kth input terminal of the n first type input terminals;

a second first-in first-out (FIFO) memory for temporarily holding an input data having at least n pin input terminals; and a de-multiplexing device coupled to the second FIFO and the n data pins of the control chipset, wherein the de-multiplexing device includes n first type output terminals, n second type output terminals, n input terminals and a selection input terminal, and a bth pin input terminal of the n pin input terminals of the second FIFO memory is connected to a jth output terminal of the n second type output terminals of the de-multiplexing device and a kth output terminal of the n first type output terminals of the de-multiplexing device;

wherein n is an integral value greater than zero and defines a total number of the data pins, and a, b, c, j, k are integral value to indicate a specific pin in the data-pin sequences.

9. The control chipset of claim 8, wherein the control chipset mounts on a computer motherboard further comprising:

a first type memory module slot for plugging a first type memory module; and a second type memory module slot for plugging a second type memory module slot;

wherein when data in the first type memory module needs to be accessed by the control chipset, the selection signal renders the n output terminals of the multiplexing device equivalent to the first type input terminals, and the selection signal renders the first type output terminals of the de-multiplexing device equivalent to the n input terminal, and when data in the second type memory module need to be accessed by the control chipset, the selection signal of the multiplexing device renders the n output terminals of the multiplexing device equivalent to the second type input terminals, and the selection signal of the de-multiplexing device renders the second type output terminals of the de-multiplexing device equivalent to the n input terminal.

10. The control chipset of claim 9, wherein both the first type memory module and the second type memory module have a memory module type data storage area and the motherboard further includes a central processing unit (CPU) that is able to read out the memory module type data through the control chipset during system boot up so that the type of memory module to be accessed can be subsequently determined.

11. The control chipset of claim 10, wherein the memory module type data is stored in an electrically erasable programmable read-only-memory (EEPROM) unit.

12. The control chipset of claim 9, wherein the multiplexing device further includes 64 2-to-1 multiplexers.

13. The control chipset of claim 9, wherein the de-multiplexing device further includes 64 1-to-2 de-multiplexers.

14. The control chipset of claim 9, wherein the value n for the number of input data pins is 64.

* * * * *